(12) United States Patent
Song (10) Patent No.: US 12,125,854 B2
(45) Date of Patent: Oct. 22, 2024

(54) DISPLAY PANEL, DISPLAY DEVICE, AND MANUFACTURING METHOD OF DISPLAY PANEL

(71) Applicant: Wuhan China Star Optoelectronics Semiconductor Display Technology Co., Ltd., Hubei (CN)

(72) Inventor: Yuelong Song, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/599,563

(22) PCT Filed: Aug. 13, 2021

(86) PCT No.: PCT/CN2021/112625
§ 371 (c)(1),
(2) Date: Sep. 29, 2021

(87) PCT Pub. No.: WO2022/252401
PCT Pub. Date: Dec. 8, 2022

(65) Prior Publication Data
US 2024/0047478 A1    Feb. 8, 2024

(30) Foreign Application Priority Data

May 31, 2021    (CN) .......................... 202110604623.X (51) Int. Cl.
*H01L 27/12*    (2006.01)
(52) U.S. Cl.
CPC ...... *H01L 27/1244* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 10,833,106 B2 * | 11/2020 | Ke | ...................... H01L 27/1218 |
| 2020/0185423 A1 * | 6/2020 | Hu | ...................... H01L 27/1218 |
| 2021/0234079 A1 * | 7/2021 | Han | ...................... H01L 27/156 |

FOREIGN PATENT DOCUMENTS

| | | |
|---|---|---|
| CN | 107424957 | 12/2017 |
| CN | 108598142 | 9/2018 |

(Continued)

OTHER PUBLICATIONS

International Search Report and the Written Opinion Dated Jan. 28, 2022 From the International Searching Authority Re. Application No. PCT/CN2021/112625 and Its Translation Into English. (13 Pages).

(Continued)

*Primary Examiner* — Bo B Jang (57) ABSTRACT

The present application provides a display panel, a display device, and a manufacturing method of the display panel. The display panel includes a substrate, an insulating layer, and an interlayer dielectric layer that are sequentially stacked. The interlayer dielectric layer includes a first section located in the display area and a second section located in the fan-out area, and a hollowed groove is defined in the second section and filled with an elastic material. Therefore, a bending resistance of film layers in the fan-out area is improved, and a problem that the film layers in the fan-out area is easily broken after bending and binding processes of the display panel is prevented.

16 Claims, 4 Drawing Sheets

(56) References Cited

FOREIGN PATENT DOCUMENTS

| | | |
|---|---|---|
| CN | 109148739 | 1/2019 |
| CN | 109244105 | 1/2019 |
| CN | 109659318 | 4/2019 |
| CN | 109671719 | 4/2019 |
| CN | 109860253 | 6/2019 |
| CN | 109950222 | 6/2019 |
| CN | 109994606 | 7/2019 |
| CN | 110233155 | 9/2019 |
| CN | 110289287 | 9/2019 |
| CN | 110428731 | 11/2019 |
| CN | 110690226 | 1/2020 |
| CN | 111063697 | 4/2020 |
| CN | 111987127 | 11/2020 |

OTHER PUBLICATIONS

Notification of Office Action and Search Report Dated May 26, 2022 From the State Intellectual Property Office of the People's Republic of China Re. Application No. 202110604623.X and Its Translation Into English. (20 Pages).

Notification of Office Action and Search Report Dated Mar. 29, 2023 From the State Intellectual Property Office of the People's Republic of China Re. Application No. 202110604623.X and Its Translation Into English. (24 Pages).

* cited by examiner

DISPLAY PANEL, DISPLAY DEVICE, AND MANUFACTURING METHOD OF DISPLAY PANEL

RELATED APPLICATIONS

This application is a National Phase of PCT Patent Application No. PCT/CN2021/112625 having International filing date of Aug. 13, 2021, which claims the benefit of priority of Chinese Patent Application No. 202110604623.X filed on May 31, 2021. The contents of the above applications are all incorporated by reference as if fully set forth herein in their entirety.

FIELD AND BACKGROUND OF THE INVENTION

The present disclosure relates to a field of display technologies, in particular to a display panel, a display device, and a manufacturing method of the display panel.

In an existing display panel, in order to increase an aspect ratio of a display area and reduce a width of a frame, an area on a substrate where a control chip is bound is usually bent to a back of the display area. However, film layers in a fan-out area of the existing display panel have poor bending performance, and after bending and binding, the film layers in the fan-out area are prone to breakage, resulting in vertical bright lines in the display panel, which affects quality of the display panel.

SUMMARY OF THE INVENTION

The present disclosure provides a display panel, a display device, and a manufacturing method of the display panel, which aims to solve a problem of vertical bright lines in an existing display panel caused by film layers in a fan-out area that are easily broken, so as to improve display quality of the display device.

In a first aspect, an embodiment of the present disclosure provides a display panel, wherein the display panel comprises a display area and a fan-out area and a bending area sequentially distributed on a side of the display area, and the display panel comprises:
  a substrate;
  a thin film transistor layer disposed on the substrate, wherein the thin film transistor layer comprises an insulating layer and an interlayer dielectric layer stacked in sequence, the interlayer dielectric layer comprises a first section located in the display area and a second section located in the fan-out area, and a hollowed groove is disposed in the second section and is filled with an elastic material; and
  a planarization layer disposed on the interlayer dielectric layer.

Alternatively, a side surface of the second section away from the insulating layer is recessed to form the hollowed groove.

Alternatively, a depth of the hollowed groove is less than or equal to a thickness of the interlayer dielectric layer.

Alternatively, in a direction from the display area to the fan-out area, a length of the hollowed groove is less than or equal to a length of the fan-out area.

Alternatively, the planarization layer fills the hollowed groove.

Alternatively, the interlayer dielectric layer comprises a third section located in the bending area, and a side surface of the third section away from the insulating layer is recessed to form a groove, and the groove is filled with an organic layer.

Alternatively, the hollowed groove extends to the third section to form the groove.

Alternatively, the organic layer comprises a first end and a second end sequentially distributed along a direction from the interlayer dielectric layer to the substrate, and the first end is located in the interlayer dielectric layer, the second end is located in the first barrier layer; the organic layer has a width in a direction from the fan-out area to the bending area, and a width of the first end is greater than a width of the second end.

Alternatively, the organic layer comprises a first end and a second end sequentially distributed along a direction from the interlayer dielectric layer to the substrate, the organic layer has a width in a direction from the fan-out area to the bending area, and a width of the first end is greater than a width of the second end.

Alternatively, the elastic material comprises an organic material.

In a second aspect, an embodiment of the present disclosure provides a display device, wherein the display device comprises a display panel comprising a display area and a fan-out area and a bending area sequentially distributed on a side of the display area, and the display panel comprises:
  a substrate;
  a thin film transistor layer disposed on the substrate, wherein the thin film transistor layer comprises an insulating layer and an interlayer dielectric layer stacked in sequence, the interlayer dielectric layer comprises a first section located in the display area and a second section located in the fan-out area, and a hollowed groove is disposed in the second section and is filled with an elastic material; and
  a planarization layer disposed on the interlayer dielectric layer.

Alternatively, a side surface of the second section away from the insulating layer is recessed to form the hollowed groove.

Alternatively, a depth of the hollowed groove is less than or equal to a thickness of the interlayer dielectric layer.

Alternatively, in a direction from the display area to the fan-out area, a length of the hollowed groove is less than or equal to a length of the fan-out area.

Alternatively, the planarization layer fills the hollowed groove.

Alternatively, the interlayer dielectric layer comprises a third section located in the bending area, and a side surface of the third section away from the insulating layer is recessed to form a groove, and the groove is filled with an organic layer.

Alternatively, the hollowed groove extends to the third section to form the groove.

Alternatively, the substrate comprises a second polyimide layer, a second barrier layer, a first polyimide layer, and a first barrier layer that are sequentially stacked, and the groove extends to the first polyimide layer.

Alternatively, the organic layer comprises a first end and a second end sequentially distributed along a direction from the interlayer dielectric layer to the substrate, and the first end is located in the interlayer dielectric layer, the second end is located in the first barrier layer; the organic layer has a width in a direction from the fan-out area to the bending area, and a width of the first end is greater than a width of the second end.

In a third aspect, an embodiment of the present disclosure provides a manufacturing method of a display panel, wherein the manufacturing method comprises the following steps:

provviding a substrate, wherein the substrate comprises a display area and a fan-out area and a bending area sequentially distributed on a side of the display area;

forming a thin film transistor layer on the substrate, wherein the thin film transistor layer comprises an insulating layer and an interlayer dielectric layer stacked in sequence, and the interlayer dielectric layer comprises a first section located in the display area and a second section located in the fan-out area;

removing at least part of the interlayer dielectric layer of the second section to form a hollowed groove;

filling the hollowed groove with an elastic material; and forming a planarization layer on the interlayer dielectric layer and the elastic material.

The display panel provided by the present disclosure comprises the display area, and the fan-out area and the bending area distributed at the side of the display area in sequence. The display panel comprises the substrate, the insulating layer, and the interlayer dielectric layer that are sequentially stacked. The interlayer dielectric layer comprises the first section located in the display area and the second section located in the fan-out area, and the hollowed groove is provided in the second section and filled with the elastic material. By setting the hollowed groove in the interlayer dielectric layer in the fan-out area and filling the hollowed groove with the elastic material, the thickness of the interlayer dielectric layer in the fan-out area is reduced, and a bending resistance of film layers in the fan-out area of the display panel is increased, which prevents a problem that the film layers in the fan-out area are prone to breakage during a bending process of the display panel due to a thicker interlayer dielectric layer in the fan-out area and poor bending resistance, thereby reducing a risk of vertical bright lines in the display panel.

BRIEF DESCRIPTION OF THE SEVERAL VIEWS OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

| Reference numerals | Component name | Reference numerals | Component name |
|---|---|---|---|
| 1 | Display panel | 10 | Display area |
| 20 | Fan-out area | 30 | Bending area |
| 11 | Substrate | 40 | Binding area |
| 12 | Thin film transistor layer | 121 | Gate layer |
| 122 | Drain-source layer | 123 | Insulating layer |
| 1231 | First insulating layer | 1232 | Second insulating layer |
| 124 | Interlayer dielectric layer | S1 | First section |
| 1241 | First interlayer dielectric layer | 1242 | Second interlayer dielectric layer |
| S2 | Second section | 130 | Hollowed groove |
| 14 | Elastic material | 15 | Planarization layer |
| S3 | Third section | 1330 | groove |
| 16 | Organic layer | 17 | Buffer layer |
| 111a | First barrier layer | 111b | Second barrier layer |
| 112a | First polyimide layer | 112b | Second polyimide |
| A | Display device | 2 | Control circuit |
| 3 | casing | 16a | First end |
| 16b | Second end | | |

DESCRIPTION OF SPECIFIC EMBODIMENTS OF THE INVENTION

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper" and "lower" generally refer to upper and lower directions of a device in actual use or working state, and specifically refer to the drawing directions in the drawings; and "inner" and "outer" refer to an outline of the device.

The embodiments of the present disclosure provide a display panel, a display device, and a manufacturing method of the display panel, which will be described in detail below. It should be noted that an order of description in the following embodiments is not meant to limit a preferred order of the embodiments.

Figure 1:
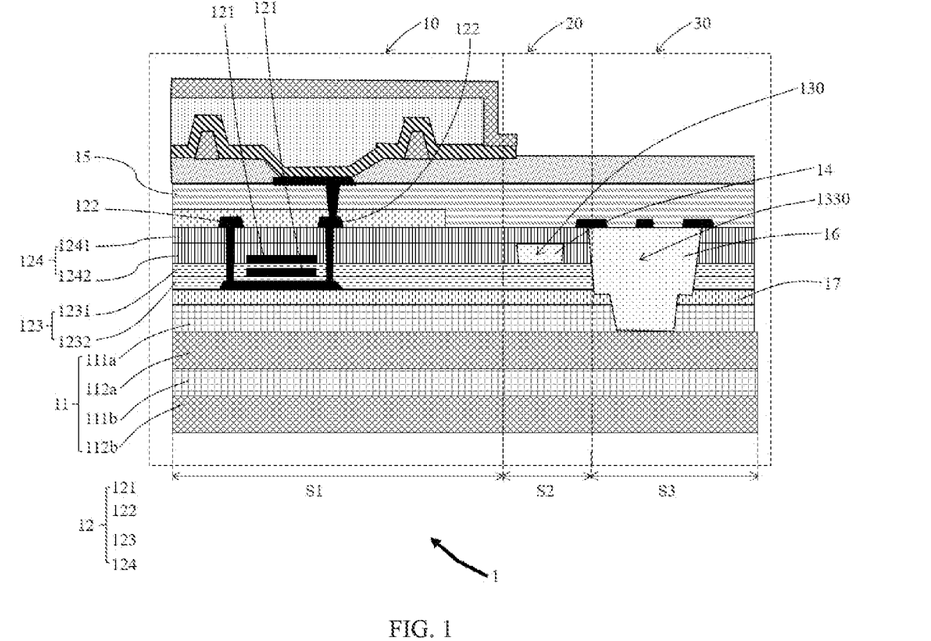
FIG. 1 is a schematic structural diagram of a display panel provided by a first embodiment of the present disclosure.

As shown in FIG. 1, a display panel 1 comprises a display area 10, and a fan-out area 20 and a bending area 30 sequentially distributed on a side of the display area 10. The display panel 1 comprises a substrate 11, a thin film transistor layer 12, and a planarization layer 15 that are stacked in sequence.

Wherein, the substrate 11 comprises a second polyimide layer 112*b*, a second barrier layer 111*b*, a first polyimide layer 112*a*, and a first barrier layer 111*a* that are stacked in sequence. Referring to FIG. 1, the thin film transistor layer 12 comprises gate layers 121, a drain-source layer 122, an insulating layer 123, and an interlayer dielectric layer 124. The insulating layer 123 comprises a first insulating layer 1231 and a second insulating layer 1232 to insulate different gate layers 121. The interlayer dielectric layer 124 comprises a first interlayer dielectric layer 1241 and a second interlayer dielectric layer 1242. The interlayer dielectric layer mainly provides electrical insulation between conductor areas and metals inside thin film transistor devices and isolation protection from surrounding environment.

Figure 3:
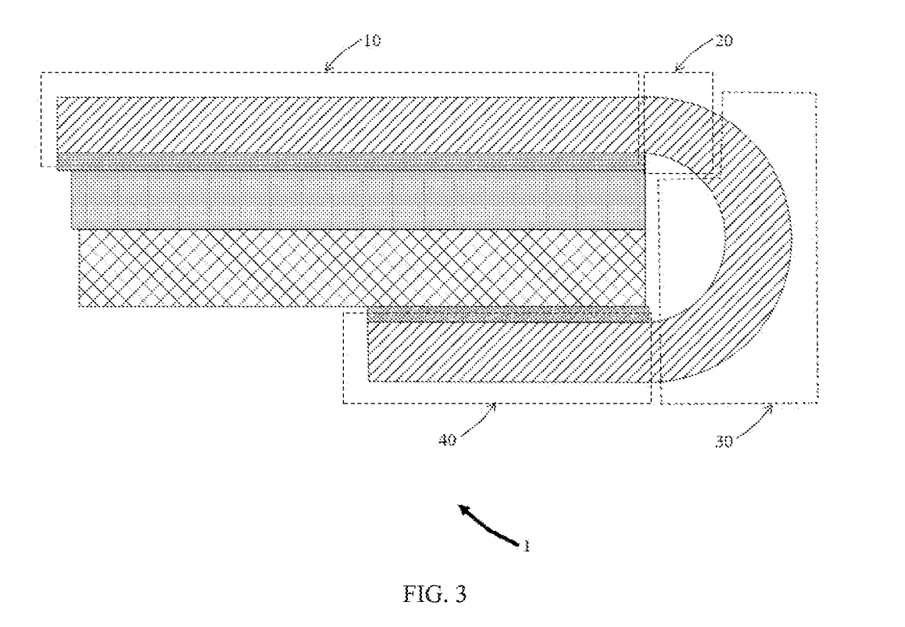
FIG. 3 is a schematic structural diagram of the display panel provided by the embodiment of the present disclosure after bending.

The insulating layer 123 comprises the first insulating layer 1231 and the second insulating layer 1232, and the interlayer dielectric layer 124 comprises the first interlayer dielectric layer 1241 and the second interlayer dielectric layer 1242. The interlayer dielectric layer 124 comprises a first section S1 located in the display area 10 and a second section S2 located in the fan-out area 20. The second section S2 is provided with a hollowed groove 130, and the hollowed groove 130 is filled with an elastic material 14. Referring to FIG. 3, after the display panel 1 is bent, the bending area 30 is located at a side of the display area 10, and a binding area 40 connected to the bending area 30 is opposite to the display area 10.

It should be noted that the fan-out area 20 is an area connecting the display area 10 and the bending area 30, and signal lines (not shown in the figures) in the display area 10 converge in the fan-out area 20 and extend through the fan-out area 20 into the bending area 30 and the binding area 40.

Since the interlayer dielectric layer 124 in the fan-out region 20 is made of an inorganic material, the interlayer dielectric layer 124 has poor bending performance and is prone to breakage during bending. As shown in FIG. 3, during a bending process of the display panel 1, the fan-out area 20 close to the bending area 30 will also be deformed, and the interlayer dielectric layer 124 in the fan-out area 20 is easily broken due to deformation, resulting in cracks of other film layers in the display panel 1.

By setting the hollowed groove 130 in the interlayer dielectric layer 124 in the fan-out area 20 and filling the hollowed groove 130 with the elastic material 14, a thickness of the interlayer dielectric layer 124 in the fan-out area 20 is reduced, and a bending resistance of film layers in the fan-out area 20 of the display panel 1 is increased, which prevents a problem that the film layers in the fan-out area 20 are prone to the breakage during the bending process of the display panel 1 due to a thicker interlayer dielectric layer 124 in the fan-out area 20 and a poor bending resistance, thereby reducing a risk of vertical bright lines in the display panel 1.

It should be noted that the elastic material 14 may be an organic material such as resin, or other materials that have elasticity and can meet bending requirements, which can be specifically determined according to actual conditions, and is not limited here.

It should be noted that the hollowed groove 130 may be formed by removing film layers on a surface of the first interlayer dielectric layer 1241, or may be formed by removing film layers on a surface of the second interlayer dielectric layer 1242. Referring to FIG. 1, in a manufacturing process of the display panel, after the second interlayer dielectric layer 1242 is formed, part of the film layers on the surface is removed to form the hollowed groove 130, the elastic material 14 is filled in the hollowed groove, and then the first interlayer dielectric layer 1241 is formed on the second interlayer dielectric layer 1242 and the elastic material 14. Therefore, the thickness of the interlayer dielectric layer 124 in the fan-out area 20 is reduced, and the bending resistance of the film layers in the fan-out area 20 is improved.

Figure 2:
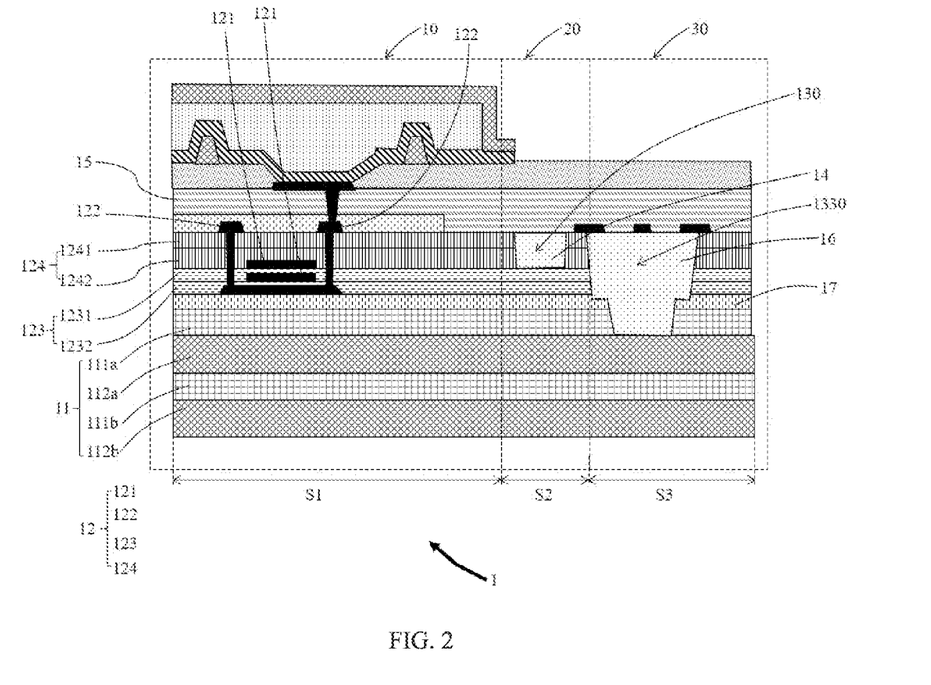
FIG. 2 is a schematic structural diagram of a display panel provided by a second embodiment of the present disclosure.

The hollowed groove 130 can also be formed by removing part of the film layers on the surface of the first interlayer dielectric layer 1241. Referring to FIG. 2, a side surface of a second section S2 of the first interlayer dielectric layer 1241 away from the insulating layer 123 is recessed to form the hollowed groove 130. That is, the hollowed groove 130 is formed by removing part of film layers on an upper surface of the first interlayer dielectric layer 1241 in the second section S2, thereby reducing the thickness of the interlayer dielectric layer 124 in the fan-out area 20 and improving the bending resistance of the film layers in the fan-out area 20. A depth of the hollowed groove 130 can be determined according to actual conditions. Preferably, the hollowed groove 130 may penetrate entire interlayer dielectric layer 124 to maximize the bending resistance of the film layers in the fan-out area 20.

In the embodiment provided in the present disclosure, the depth of the hollowed groove 130 is less than or equal to the thickness of the interlayer dielectric layer 124. Preferably, as shown in FIG. 2, the depth of the hollowed groove 130 is equal to the thickness of the interlayer dielectric layer 124. Therefore, the thickness of the interlayer dielectric layer 124 in the fan-out area 20 can be minimized, and a bending performance of film layers of the display panel 1 in the fan-out area 20 can be improved, and at the same time, it can be ensured that the insulating layer 123 under the interlayer dielectric layer 124 will not be removed, so as to prevent affecting metal wires in the insulating layer 123.

It should be noted that after removing part of the interlayer dielectric layer 124 on a surface of the second section S2 to form the hollowed groove 130, the hollowed groove 130 may be filled with the elastic material 14 first, and then the planarization layer 15 is formed on the interlayer dielectric layer 124. The planarization layer 15 can also be formed directly after the hollowed groove 130 is formed.

Figure 4:
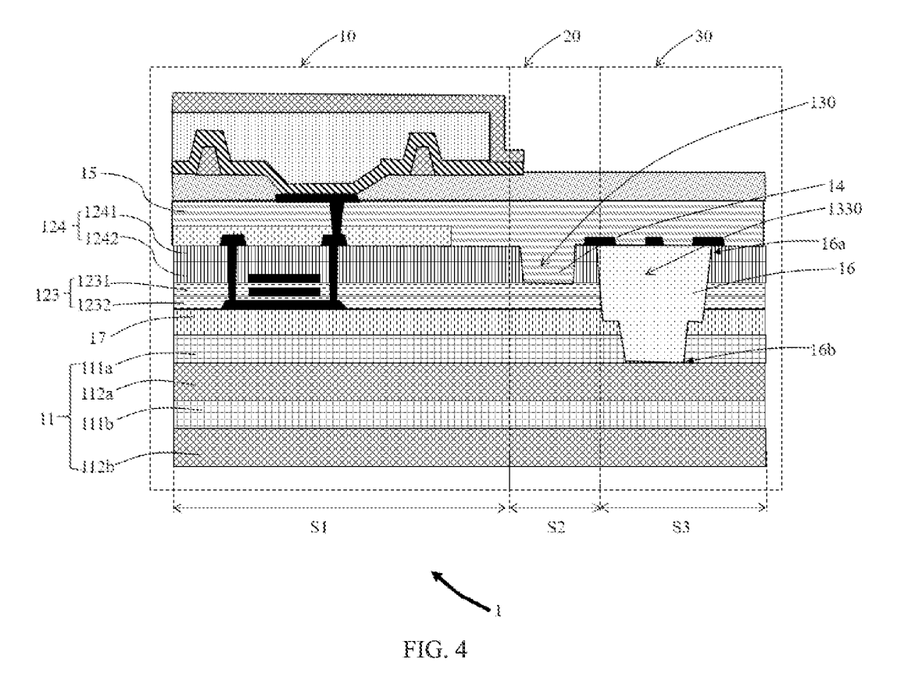
FIG. 4 is a schematic structural diagram of a display panel provided by a third embodiment of the present disclosure.

In a third embodiment of the present disclosure, as shown in FIG. 4, the planarization layer 15 fills the hollowed groove 130, that is, the elastic material 14 is part of the planarization layer 15. During the manufacturing process of the display panel 1, the insulating layer 123 and the interlayer dielectric layer 124 are sequentially formed on the substrate 11. After removing the part of the interlayer dielectric layer 124 on the surface of the second section S2, the planarization layer 15 is formed on the interlayer dielectric layer 124 by deposition so that the planarization layer 15 fills the hollowed groove 130 to form the elastic material 14. Since the planarization layer 15 is usually made of organic materials, a bending resistance is better than that of the interlayer dielectric layer 124. Therefore, filling the hollowed groove 130 with the planarization layer 15 can improve the bending resistance of the film layers in the fan-out area 20 of the display panel 1 and prevent the film layers in the fan-out area 20 from the breakage during the bending process.

It should be noted that in a direction from the display area 10 to the fan-out area 20, a length of the hollowed groove 130 can be determined according to actual conditions. It can be understood that the greater the length of the hollowed groove 130, the more the interlayer dielectric layer 124 in the fan-out area 20 is removed, and the more beneficial it is to improve the bending resistance of the film layers in the fan-out area 20. Preferably, in the direction from the display area 10 to the fan-out area 20, the length of the hollowed groove 130 is less than or equal to a length of the fan-out area 20.

Figure 5:
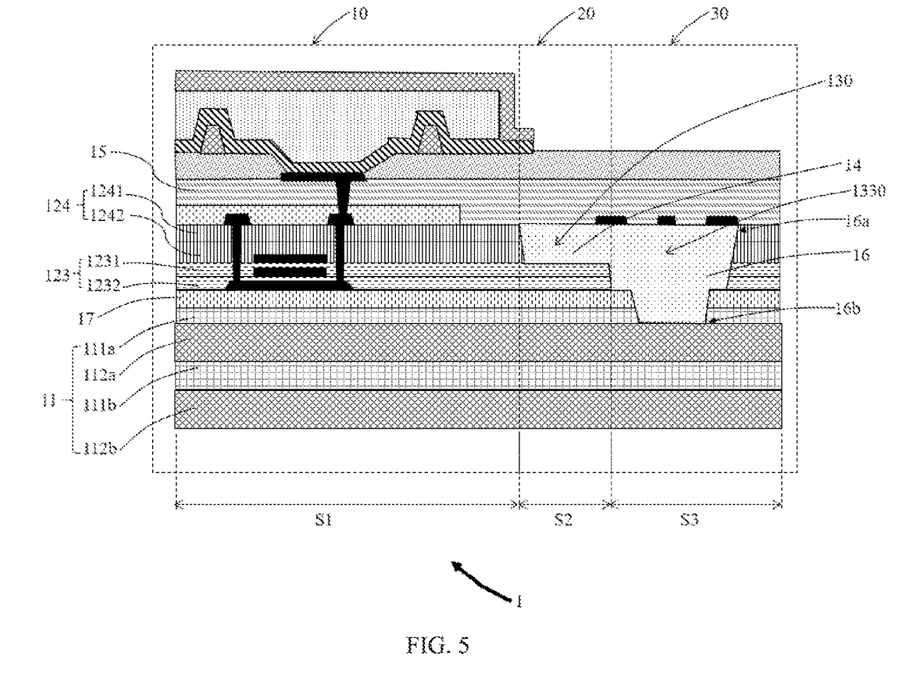
FIG. 5 is a schematic structural diagram of a display panel provided by a fourth embodiment of the present disclosure.

In a fourth embodiment of the present disclosure, as shown in FIG. in the direction from the display area 10 to the fan-out area 20, the length of the hollowed groove 130 is equal to the length of the fan-out area 20. On the basis of not affecting film layers in the display area 10, the bending resistance of the film layers in the fan-out area 20 is maximized.

In conjunction with FIGS. 2, 4 and 5, the interlayer dielectric layer 124 comprises a third section S3 located in the bending area 30, and a side surface of the third section S3 away from the insulating layer 123 is recessed to form a groove 1330. The groove 1330 is filled with an organic layer 16. The organic layer 16 passes through the insulating layer 123, a buffer layer 17, and a barrier layer 18 and extends to the first polyimide layer 112a. Both the elastic material 14 and the organic layer 16 penetrate the interlayer dielectric layer 124, and part of the organic layer 16 that penetrates the interlayer dielectric layer 124 is in a same layer as the elastic material 14.

It should be noted that in the embodiment provided in the present disclosure, in conjunction with FIG. 2, FIG. 4, FIG. 5, and FIG. 6, the groove 1330 extends to the first polyimide layer 112a. Therefore, it prevents more film layers on the substrate 11 from being removed when the groove 1330 continues to extend downward, which prevents integrity of the substrate 11 from being excessively damaged, and ensures structural strength of the substrate 11.

During the manufacturing process of the display panel 1, the insulating layer 123 and the interlayer dielectric layer 124 are sequentially formed on the substrate 11. In order to improve a bending resistance of film layers in the bending area 30 so as not to break during the bending process, part of the interlayer dielectric layer 124 on a surface of the third section S3 is removed to form the groove 1330, and then the organic layer 16 is filled in the groove 1330. It can be understood that a depth of the groove 1330 can be determined according to actual conditions.

Figure 6:
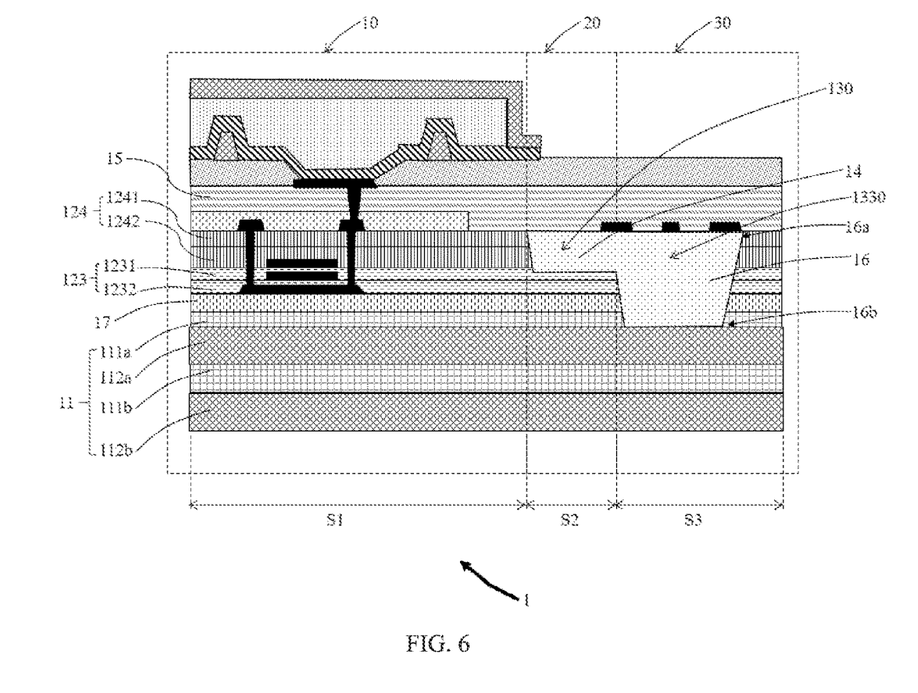
FIG. 6 is a schematic structural diagram of a display panel provided by a fifth embodiment of the present disclosure.

Referring to FIG. 4, FIG. 5, and FIG. 6, the organic layer 16 comprises a first end 16a and a second end 16b that are sequentially distributed along a direction from the interlayer dielectric layer 124 to the substrate 11. The first end 16a is located in the interlayer dielectric layer 124, the second end is located in the first barrier layer 111a, and the organic layer 16 has a width from the fan-out area 20 to the bending area 30. It should be noted that a width of the first end 16a may be equal to a width of the second end 16b, or may be greater than the width of the second end 16b.

Preferably, in the embodiment provided by the present disclosure, in conjunction with FIGS. 4, 5, and 6, the width of the first end 16a is greater than the width of the second end 16b. That is to say, a width of the groove 1330 at the first end 16a is also greater than the width of the second end 16b. By making the width of the first end 16a of the organic layer 16 greater than the width of the second end 16b, when the groove 1330 is formed, it can reduce part of the first barrier layer 111a on the substrate 11 to be excavated, so as to ensure the structural strength of the substrate 11. In addition, a process is easier to implement when removing each film layer to form the groove 1330.

It should be noted that the elastic material 14 in the fan-out area 20 and the organic layer 16 in the bending area 30 may be disconnected or connected to each other. As shown in FIG. 2, the elastic material 14 in the fan-out area 20 and the organic layer 16 in the bending area 30 are disconnected, that is, the hollowed groove 130 does not extend to the bending area 30. Therefore, by removing only part of the interlayer dielectric layer 124 in the bending area 30, the thickness of the interlayer dielectric layer 124 in the fan-out area 20 can also be reduced, and the bending resistance of the film layers in the fan-out area 20 of the display panel 1 can be improved.

As shown in FIG. 5, in the fourth embodiment of the present disclosure, the elastic material 14 in the fan-out area 20 and the organic layer 16 in the bending area 30 are connected to each other. The hollowed groove 130 extends to the third section S3 to form the groove 1330. That is, after the interlayer dielectric layer 124 on the surface of the second section S2 is removed to form the hollowed groove 130, the hollowed groove 130 continues to extend into the bending area 30. The interlayer dielectric layer 124 on the surface of the third section S3 is removed to form the groove 1330, so that the hollowed groove 130 and the groove 1330 are connected. Then, the organic layer 16 is filled in the hollowed groove 130 and the groove 1330. At this time, the elastic material 14 in the fan-out area 20 is connected to the organic layer 16 in the bending area 30, that is, the elastic material 14 in the hollowed groove 130 is part of the organic layer 16.

By extending the hollowed groove 130 to the third section S3 to form the groove 1330, the hollowed groove 130 and the groove 1330 can be integrated, and the manufacturing process of the display panel 1 is simplified. At the same time, more interlayer dielectric layer 124 in the fan-out area 20 is removed, which further improves the bending resistance of the film layers in the fan-out area 20.

It should be noted that the hollowed groove 130 and the groove 1330 can also be realized on the basis of an existing manufacturing process. When removing the interlayer dielectric layer 124 in the bending area 30 to form the groove 1330 that can be filled with the organic layer 16, the groove 1330 is extended into the fan-out area 20. That is, part of the interlayer dielectric layer 124 in the fan-out area 20 is continuously removed to form the hollowed groove 130, and the hollowed groove 130 is in communication with the groove 1330. Therefore, in a subsequent process of filling the organic layer 16, the hollowed groove 130 in the fan-out area 20 and the groove 1330 in the bending area 30 can be simultaneously filled with the organic layer 16. While improving the bending resistance of the film layers in the fan-out area 20, no extra manufacturing processes are added.

The embodiment of the present disclosure also provides a display device. The display device A comprises the display panel 1. A specific structure of the display panel 1 refers to above-mentioned embodiments. Since the display device A adopts all technical solutions of all the above-mentioned embodiments, it has at least all beneficial effects brought by the technical solutions of the above-mentioned embodiments, which will not be repeated here.

Wherein, the display device A is any display device with above-mentioned display panel, such as a mobile phone, a tablet computer, a TV, a monitor, etc., which is not limited here.

Figure 7:
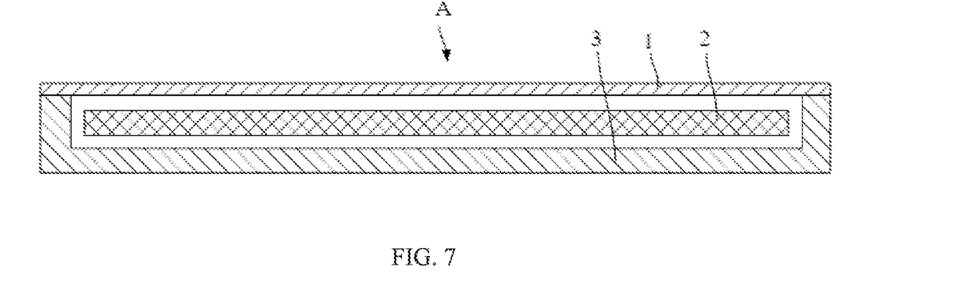
FIG. 7 is a schematic structural diagram of a display device provided by an embodiment of the present disclosure.

As shown in FIG. 7, the display device A comprises a display panel 1, a control circuit 2, and a casing 3. The casing 3 is connected to the display panel 1 to support and fix the display panel 1, and the control circuit 2 is disposed in the casing 3 and electrically connected to the display panel 1 to control the display panel 1 to display images.

Wherein, the display panel 1 can be fixed to the casing 3, and the display panel 1 and the casing 3 form a closed space to accommodate the control circuit 2. The control circuit 2 can be a main board of the display device A, and the control circuit 2 can be integrated with one, two, or more of functional components such as a battery, an antenna structure, a microphone, a speaker, an earphone interface, an universal serial bus interface, a camera, a distance sensor, an ambient light sensor, a receiver, a processor, etc.

It should be noted that the display device A is not limited to above content, and it may also comprise other devices, such as a camera, an antenna structure, a fingerprint unlocking module, etc., which are not limited here.

Figure 8:
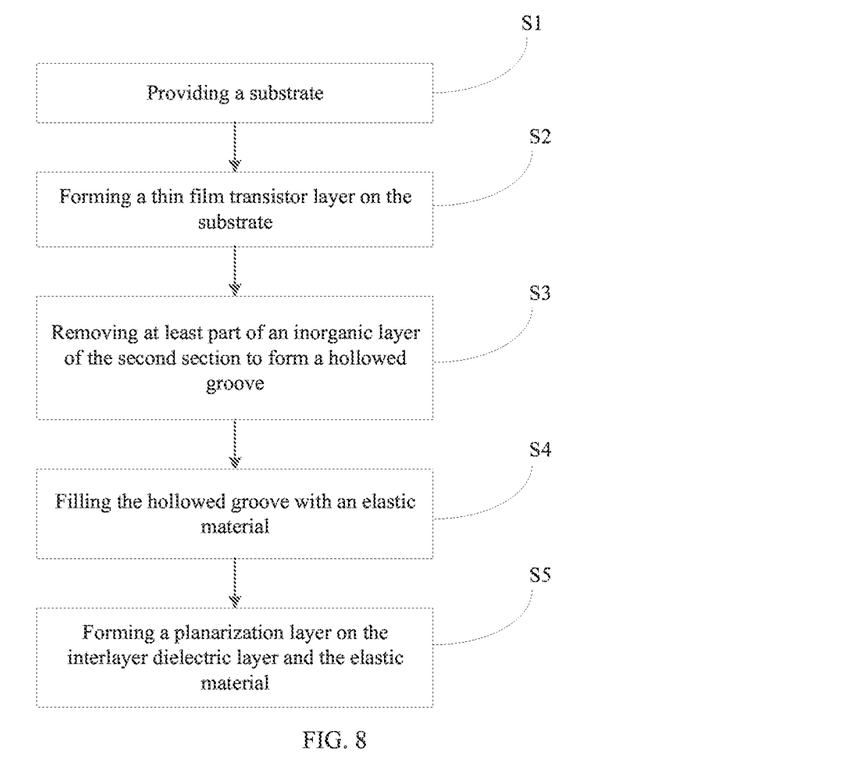
FIG. 8 is a flowchart of a manufacturing method of the display panel provided by an embodiment of the present disclosure.

Finally, the present disclosure provides a manufacturing method of the display panel 1, as shown in FIG. 8, and the manufacturing method comprises following steps:

S1, providing the substrate 11, wherein the substrate 11 comprises the display area 10, and the fan-out area 20 and the bending area 30 sequentially distributed on the side of the display area 10;

S2, forming the thin film transistor layer on the substrate, wherein the thin film transistor layer comprises the insulating layer and the interlayer dielectric layer stacked in sequence, and the interlayer dielectric layer comprises the first section located in the display area and the second section located in the fan-out area;

S3, removing at least part of the interlayer dielectric layer 124 of the second section S2 to form the hollowed groove 130;

S4, filling the hollowed groove 130 with the elastic material 14; and

S5, forming the planarization layer 15 on the interlayer dielectric layer 124 and the elastic material 14.

The substrate 11 comprises the display area 10, and the fan-out area and the bending area 30 sequentially distributed on the side of the display area 10. The insulating layer 123 and the interlayer dielectric layer 124 are sequentially stacked on the substrate 11 by the deposition. The interlayer dielectric layer 124 comprises the first section S1 located in the display area 10 and the second section S2 located in the fan-out area 20. Part or all of the interlayer dielectric layer 124 of the second section S2 is removed to form the hollowed groove 130, and the removal of the interlayer dielectric layer 124 can be achieved by laser etching.

After the hollowed groove 130 is formed, the elastic material is filled in the hollowed groove 130 to form the elastic material 14. After filling the elastic material, the surface of the interlayer dielectric layer 124 can be flattened, which facilitates metal wires on the interlayer dielectric layer 124. The elastic material needs to meet performance requirements of the bending resistance, and organic materials such as resin can be used. After filling the hollowed groove 130 with the elastic material, the planarization layer 15 is formed on the interlayer dielectric layer 124 by the deposition.

It should be noted that in a process of removing the interlayer dielectric layer 124 of the second section S2 to form the hollowed groove 130, the hollowed groove 13 can be extended into the bending area 30 to form the groove 1330 in the third section S3. Referring to FIG. 4, after removing the interlayer dielectric layer 124 on the surface of the second section S2 to form the hollowed groove 130, the interlayer dielectric layer 124 on the surface of the third section S3 is continuously removed to form the groove 1330. The hollowed groove 130 is in communication with the groove 1330, and then the organic layer 16 is filled in the hollowed groove 130 and the groove. At this time, the elastic material 14 in the fan-out area 20 is connected to the organic layer 16 in the bending area 30, and the elastic material 14 is the part of the organic layer 16.

After the display panel 1 is bent, the bending area 30 is located at the side of the display area 10, and the binding area 40 connected to the bending area is opposite to the display area 10. By defining the hollowed groove 130 in the interlayer dielectric layer 124 in the fan-out area 20 and filling the elastic material 14 in the hollowed groove 130, the thickness of the interlayer dielectric layer 124 in the fan-out area 20 is reduced, and the bending resistance of the film layers in the fan-out area 20 of the display panel 1 is increased, which prevents the problem that the film layers in the fan-out area 20 are prone to the breakage during bending and binding processes of the display panel 1 due to the thicker interlayer dielectric layer 124 in the fan-out area 20 and the poor bending resistance, thereby reducing the risk of the vertical bright lines in the display panel 1.

The display panel, the display device, and the manufacturing method of the display panel provided in the embodiments of the present disclosure are described in detail above. In this article, specific examples are used to explain principles and implementation of the present disclosure. The description of the above embodiments is only used to help understand the technical solutions and core ideas of the present disclosure; those of ordinary skilled in the art should understand that it is still possible to modify the technical solutions recorded in the foregoing embodiments, or equivalently replace some of technical features, and these modifications or replacements do not cause the essence of the corresponding technical solutions to deviate from the scope of the technical solutions of the embodiments of the present disclosure.

What is claimed is:

1. A display panel, wherein the display panel comprises a display area, and a fan-out area, and a bending area sequentially distributed on a side of the display area, and the display panel comprises:
   a substrate;
   a thin film transistor layer disposed on the substrate, wherein the thin film transistor layer comprises an insulating layer and an interlayer dielectric layer stacked in sequence, the interlayer dielectric layer comprises a first section located in the display area, a second section located in the fan-out area, and a third section located in the bending area, a hollowed groove is disposed in the second section and is filled with an elastic material, the hollowed groove extends to the third section to form a groove, the groove is recessed from a side surface of the third section away from the insulating layer and is filled with an organic layer; and
   a planarization layer disposed on the interlayer dielectric layer.

2. The display panel of claim 1, wherein a side surface of the second section away from the insulating layer is recessed to form the hollowed groove.

3. The display panel of claim 2, wherein a depth of the hollowed groove is less than or equal to a thickness of the interlayer dielectric layer.

4. The display panel of claim 2, wherein, in a direction from the display area to the fan-out area, a length of the hollowed groove is less than or equal to a length of the fan-out area.

5. The display panel of claim 1, wherein the planarization layer fills the hollowed groove.

6. The display panel of claim 1, wherein the substrate comprises a second polyimide layer, a second barrier layer, a first polyimide layer, and a first barrier layer that are sequentially stacked, and the groove extends to the first polyimide layer.

7. The display panel of claim 6, wherein the organic layer comprises a first end and a second end sequentially distributed along a direction from the interlayer dielectric layer to the substrate, the first end is located in the interlayer dielectric layer, and the second end is located in the first barrier layer; the organic layer has a width in a direction from the fan-out area to the bending area, and a width of the first end is greater than a width of the second end.

8. The display panel of claim 1, wherein the elastic material comprises an organic material.

9. A display device, wherein the display device comprises a display panel comprising a display area, and a fan-out area, and a bending area sequentially distributed on a side of the display area, and the display panel comprises:
   a substrate;
   a thin film transistor layer disposed on the substrate, wherein the thin film transistor layer comprises an insulating layer and an interlayer dielectric layer stacked in sequence, the interlayer dielectric layer comprises a first section located in the display area, a second section located in the fan-out area, and a third section located in the bending area, a hollowed groove is disposed in the second section and is filled with an elastic material, the hollowed groove extends to the third section to form a groove, the groove is recessed from a side surface of the third section away from the insulating layer and is filled with an organic layer; and
   a planarization layer disposed on the interlayer dielectric layer.

10. The display device of claim 9, wherein a side surface of the second section away from the insulating layer is recessed to form the hollowed groove.

11. The display device of claim 10, wherein a depth of the hollowed groove is less than or equal to a thickness of the interlayer dielectric layer.

12. The display device of claim 10, wherein, in a direction from the display area to the fan-out area, a length of the hollowed groove is less than or equal to a length of the fan-out area.

13. The display device of claim 9, wherein the planarization layer fills the hollowed groove.

14. The display device of claim 9, wherein the substrate comprises a second polyimide layer, a second barrier layer, a first polyimide layer, and a first barrier layer that are sequentially stacked, and the groove extends to the first polyimide layer.

15. The display device of claim 14, wherein the organic layer comprises a first end and a second end sequentially distributed along a direction from the interlayer dielectric layer to the substrate, the first end is located in the interlayer dielectric layer, and the second end is located in the first barrier layer; the organic layer has a width in a direction from the fan-out area to the bending area, and a width of the first end is greater than a width of the second end.

16. A manufacturing method of a display panel, wherein the manufacturing method comprises following steps:
   providing a substrate, wherein the substrate comprises a display area, and a fan-out area and a bending area sequentially distributed on a side of the display area;
   forming a thin film transistor layer on the substrate, wherein the thin film transistor layer comprises an insulating layer and an interlayer dielectric layer stacked in sequence, and the interlayer dielectric layer comprises a first section located in the display area, a second section located in the fan-out area, and a third section located in the bending area;
   removing at least part of the interlayer dielectric layer of the second section to form a hollowed groove; wherein the hollowed groove extends to the third section to form a groove, the groove is recessed from a side surface of the third section away from the insulating layer;
   filling the hollowed groove and filling the groove with an elastic material; and
   forming a planarization layer on the interlayer dielectric layer and the elastic material.

* * * * *